United States Patent [19]
Oyamatsu

[11] Patent Number: 5,923,969
[45] Date of Patent: Jul. 13, 1999

[54] METHOD FOR MANUFACTURING A SEMICONDUCTOR DEVICE HAVING A LIMITED POCKET REGION

[75] Inventor: Hisato Oyamatsu, Yokohama, Japan

[73] Assignee: Kabushiki Kaisha Toshiba, Kawaski, Japan

[21] Appl. No.: 08/997,888

[22] Filed: Dec. 24, 1997

[30] Foreign Application Priority Data

Jan. 7, 1997 [JP] Japan .................................. 9-011937

[51] Int. Cl.$^6$ .......................... H01L 21/28; H01L 21/46
[52] U.S. Cl. ......................... 438/183; 438/229; 257/365
[58] Field of Search ................ 257/41, 281, 421, 257/408, 336, 335; 438/183, 200, 174, 578, 286, 571, 229

[56] References Cited

U.S. PATENT DOCUMENTS

| | | | |
|---|---|---|---|
| 4,590,665 | 5/1986 | Owens et al. | 438/201 |
| 4,963,501 | 10/1990 | Ryan et al. | 438/183 |
| 4,975,382 | 12/1990 | Takasugi | 438/183 |
| 5,336,624 | 8/1994 | Walden | 438/200 |
| 5,410,161 | 4/1995 | Narita | 257/41 |
| 5,426,326 | 6/1995 | Ohyu et al. | 257/408 |
| 5,449,937 | 9/1995 | Arimura et al. | 257/336 |

*Primary Examiner*—Olik Chaudhuri
*Assistant Examiner*—William David Coleman
*Attorney, Agent, or Firm*—Banner & Witcoff, Ltd.

[57] ABSTRACT

In order to reduce the thickness of an impurity diffusion region of a first conductivity type formed near the surface of a semiconductor substrate, a pocket region is formed under the impurity diffusion region. If the pocket region is large, a junction capacitance between the impurity diffusion region and the pocket region cannot be neglected. In order to reduce the size of the pocket region to the minimum permissible size, gates and dummy gates which are temporarily formed to suppress the non-uniformity of the gate dimensions by uniformly giving an influence of the optical proximity effect to a plurality of gates are used as a mask used for implanting an impurity into the surface portion of the semiconductor substrate to form the pocket regions. Thus, the pocket region can be formed in a limited area between the gate and the dummy gate.

19 Claims, 11 Drawing Sheets

METHOD FOR MANUFACTURING A SEMICONDUCTOR DEVICE HAVING A LIMITED POCKET REGION

BACKGROUND OF THE INVENTION

This invention relates to a semiconductor device and a method for manufacturing the same, and more particularly to a method for manufacturing the gates of MOSFETs and the impurity profile of a diffusion layer formed with the gates used as a mask pattern.

The progress of the miniaturization technique in the semiconductor manufacturing process has enhanced the integration density of devices on one chip and maintained the high performance of the devices. When the above fact is taken into consideration, it becomes important to suppress a fluctuation in the performance of the devices in the process for a semiconductor device (LSI) which is an assembly of fine-patterned devices.

Cross sectional views of FIGS. 1A to 3 show a method for manufacturing a conventional semiconductor device. First, a p-type impurity diffusion region (p well) 2 and an n-type impurity diffusion region (n well) 3 used for forming nMOSFETs and pMOSFETs are formed in the surface area of a semiconductor substrate 1. Next, in order to electrically isolate elements from one another, a field oxide film ($SiO_2$) 4 is formed by the selective oxidation method. Then, the impurity concentrations of the regions in the surface area of the semiconductor substrate are modified to adjust the threshold voltages (Vth) of the MOSFETs. The adjusting process is effected by implanting impurity ion from above a photoresist mask formed by the lithography process.

Figure 1A:
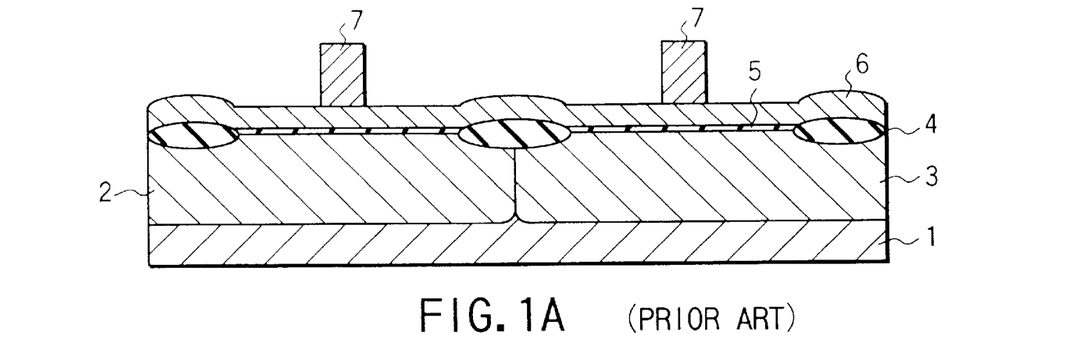
FIG. 1A is a cross sectional view showing the conventional process for transferring a gate pattern onto a photoresist.

Next, a silicon oxide film 5 used as a gate insulating film is formed on the semiconductor substrate by the thermal oxidation method. A polysilicon film 6 is formed on the silicon oxide film 5 by the LPCVD (Low Pressure Chemical Vapour Deposition) method or the like.

Then, a gate electrode pattern is transferred onto a photoresist 7 by the lithography process (FIG. 1A). The polysilicon film 6 is selectively etched to form gates in a pattern corresponding to the mask pattern. For the etching process, anisotropic etching such as RIE (Reactive Ion Etching) having directivity and having a high selective etching ratio with respect to $SiO_2$ is used.

Figure 1B:
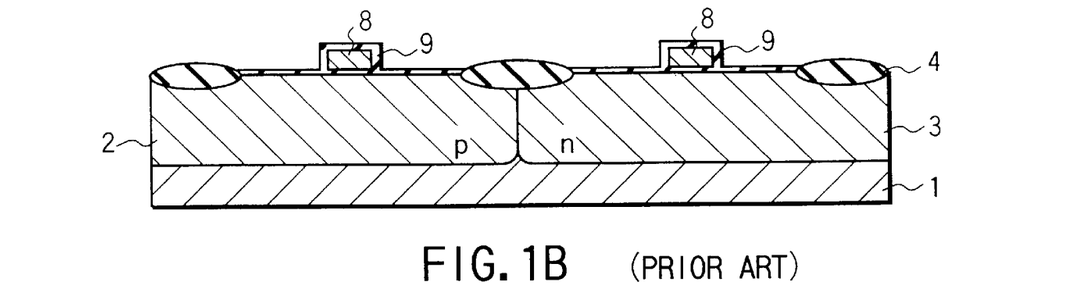
FIG. 1B is a cross sectional view showing the conventional process for forming a gate oxide film.
Figure 2A:
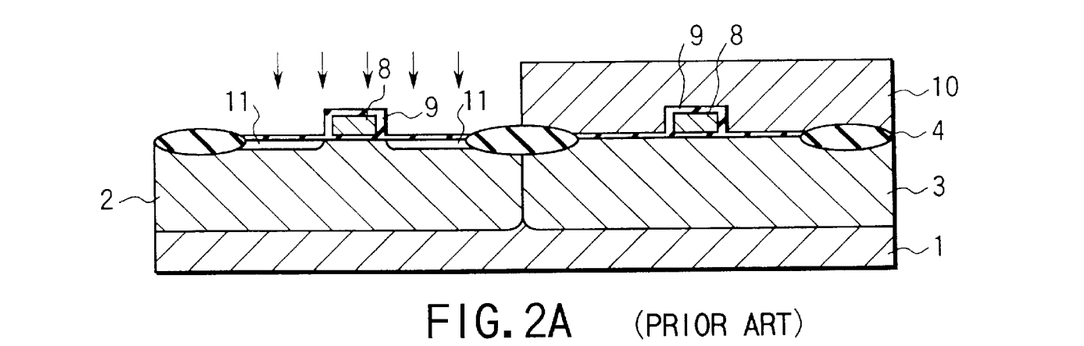
FIG. 2A is a cross sectional view showing the conventional process for forming extension regions near the surface of an n well.

After this, the resist is removed. In order to prevent the electric field from being concentrated on the gate edge portion, an oxide film 9 is formed to a thickness of approx. 10 nm around the gates 8 (FIG. 1B). Next, a photoresist pattern 10 is formed on the n well 3. Then, an ion-implantation process is effected with the photoresist pattern 10 and the gate 8 on the p well 2 used as a mask. As a result, n-type extension regions 11 of small film thickness are formed (FIG. 2A). The impurity profile in the depth direction of the extension region 11 steeply changes in the intermediate concentration range of approx. 5E18 to 1E20 $cm^{-3}$.

Figure 2B:
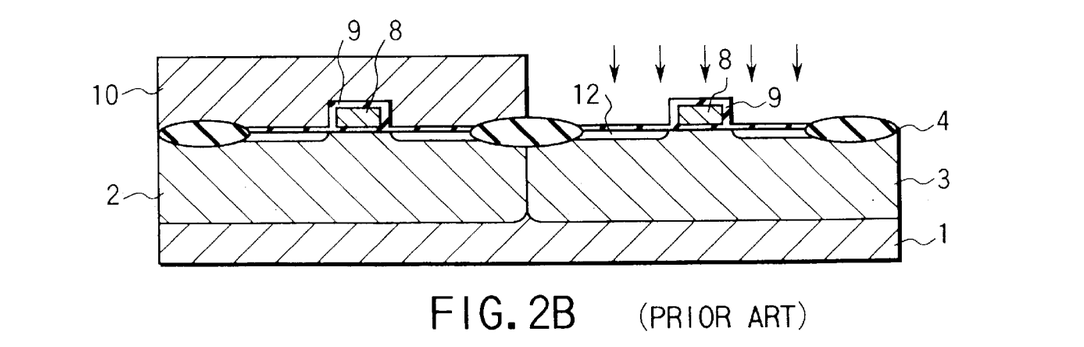
FIG. 2B is a cross sectional view showing the conventional process for forming extension regions near the surface of a p well.

Next, the photoresist pattern 10 is removed. Then, a photoresist pattern 10' is formed to cover the p well 2. Then, an ion-implantation process is effected with the photoresist pattern 10' and the gate 8 on the n well 3 used as a mask. As a result, extension regions 12 of small film thickness are formed (FIG. 2B). The impurity profile in the depth direction of the extension region 12 steeply changes in the intermediate concentration range of approx. 5E18 to 1E20 $cm^{-3}$.

The extension regions 11, 12 are annealed at 1000° C. for approx. 30 sec. and activated after the resist pattern is removed.

The impurity concentration of an LDD region of a MOSFET having a conventional LDD structure is lower than that of the extension region and is equal to or lower than 5E18 $cm^{-3}$. The impurity concentration of the source/drain region of the MOSFET is generally approx. 1E20 $cm^{-3}$ and corresponds to that of a high impurity concentration region. Therefore, if the impurity diffusion regions of the semiconductor substrate are defined according to the impurity concentration, the LDD region, extension region and source/drain region can be defined as a low concentration region, intermediate concentration region and high concentration region, respectively.

Figure 3:
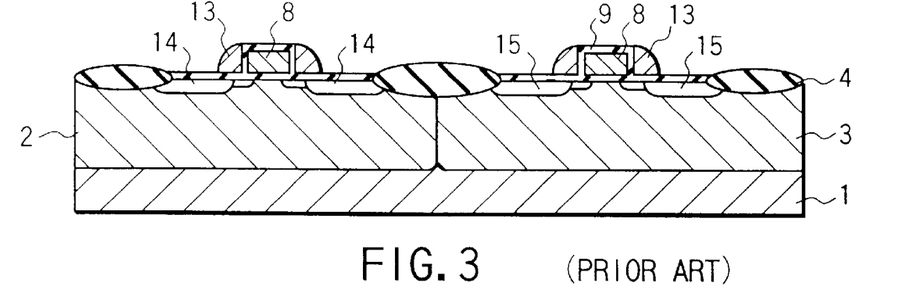
FIG. 3 is a cross sectional view showing the conventional process for forming insulating films on the side walls of gates.

Next, $Si_3N_4$ is deposited to a thickness of approx. 100 nm on the entire surface of the semiconductor substrate 1 by the LPCVD method. The deposited $Si_3N_4$ layer is selectively etched in preference to the underlying oxide film ($SiO_2$) film 9 by the anisotropic etching process such as RIE. As a result, side wall insulating films 13 are formed on the side walls of the gates 8.

Further, like the case of formation of the extension region, impurity regions 14, 15 of high impurity concentration (approx. 1E20 to 1E21 $cm^{-3}$) are formed in the respective regions of the MOSFETs by the ion-implantation technique by using a resist pattern (not shown) formed by the lithography process and the gates as a mask and the impurity regions are annealed at 1000° C. for approx. 30 sec. and activated. The impurity diffusion regions of the nMOSFET formed in the p well 2 are used as the n-type source/drain regions 14 and the impurity diffusion regions of the pMOSFET formed in the n well 3 are used as the p-type source/drain regions 15.

The extension regions 11, 12 are required to be formed shallow with a steeply changing impurity profile in order to suppress the short channel effect of the MOSFET, but since the source/drain regions 14, 15 are separated from the channel regions by a distance of the side wall length, they can be formed deeper with higher impurity concentration, thereby making it possible to reduce the sheet resistance of the source/drain region and realize highly operative MOSFETs. Further, the operation of doping impurity into the gate is effected at the same time that the $n^+$ regions and $p^+$ regions of the source/drain regions are formed. After this, an inter-level insulating film is formed by the LPCVD method and a wiring layer and the like are formed by use of a normal metallization process. Thus, a final semiconductor device (LSI) is completed.

Figure 4A:
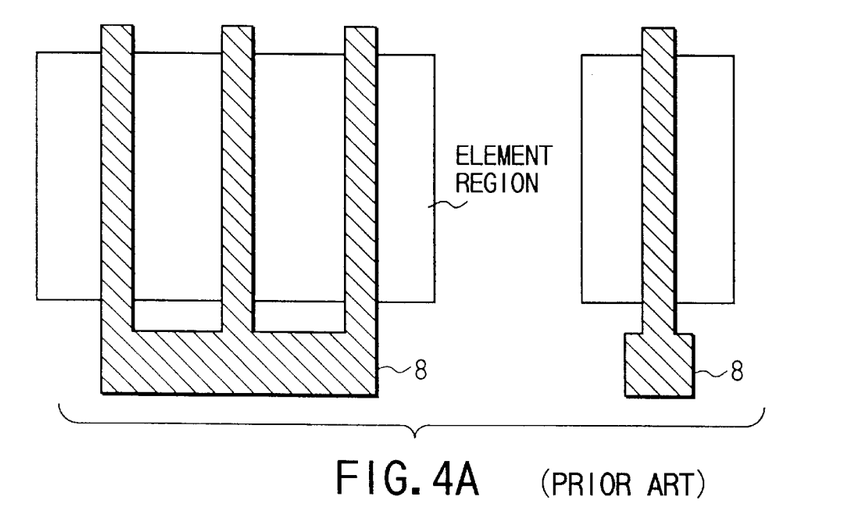
FIGS. 4A, 4B are plan views showing gate patterns with various pitches.
Figure 4B:
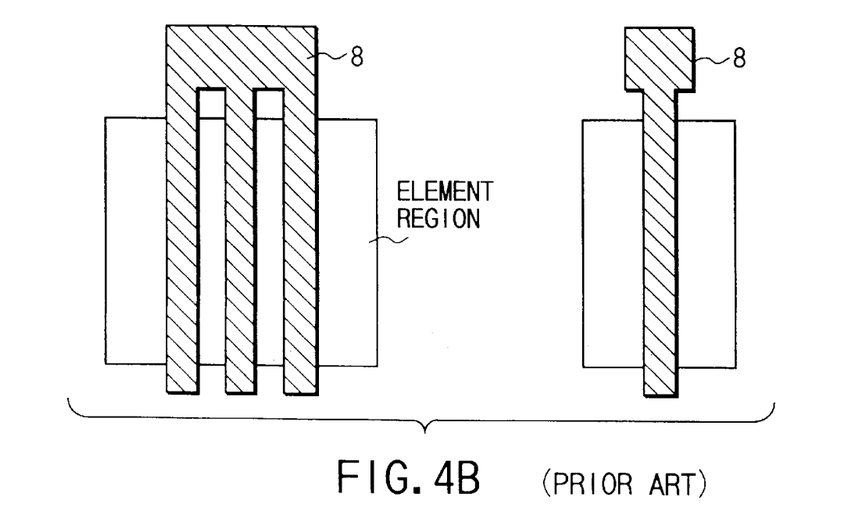

FIGS. 4A, 4B show conventional gate electrode patterns. Gate pitches (intervals) in the semiconductor device (LSI) are set to various values. Even in a memory having the same pattern repeated many times in a simple form, the gate pitch is not uniform in the sense amplifier section and in the peripheral I/O section. Further, the non-uniformity of the gate pitch in the logic device is more significant.

The gate dimension of the MOSFET is one of the most important parameters for determining the performance of the semiconductor device (LSI). Enhancement of the performance of the LSI by miniaturization of the MOSFET is largely dependent on a reduction in the gate width (gate length).

It has become possible to form a fine pattern by reducing the wavelength of light used in the lithography and improving the photoresist material. However, the optical proximity effect and the loading effect of the photoresist occurring at the development/etching time cause an error in the gate dimension depending on the pitch or the like. The dimensional error of the gate lowers the manufacturing yield of the LSI and makes the margin design complex.

As a method for suppressing occurrence of the gate dimensional error, a method for designing a gate mask used for the lithography by repeatedly simulating the mask with the dimensional error taken into consideration is provided. However, it is necessary to take an influence by the two-dimensional process factor into consideration in order to correct the error, a long time is required for simulation in an LSI such as a logic device having various types of layouts, and some of the methods are not suitable for the actual mass production technique. In the simulation, the operation of modeling and recognizing variations in a gas, material and the like used in the process becomes necessary and it is difficult to promptly cope with the variations.

Figure 5A:
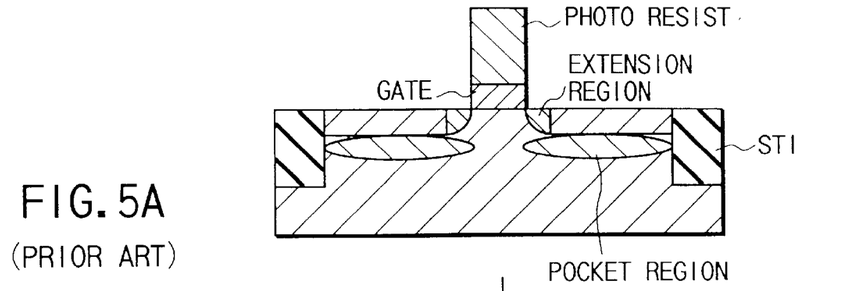
FIG. 5A is a cross sectional view showing the conventional process for forming pocket regions under the extension regions.
Figure 5B:
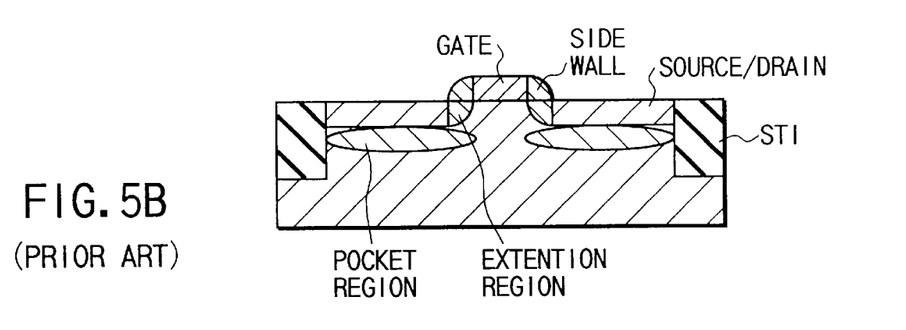
FIG. 5B is a cross sectional view showing the conventional process for forming insulating films on the side walls of the gate after formation of the pocket regions.

As shown in FIGS. 5A, 5B, pocket regions are formed under the extension regions in some cases in order to reduce the thickness of the extension regions and improve the short channel effect. Impurity of a conductivity type different from that of the extension region is ion-implanted into the pocket region. Therefore, the impurity concentration of the extension region steeply changes in the depth direction and the extension region is made thin and the punchthrough characteristic is improved.

The pocket region is an impurity diffusion region containing impurity of the same conductivity type as that of the semiconductor substrate and having an impurity concentration of 1E17 cm$^{-3}$ or more which is higher than that of the semiconductor substrate. The pocket region is formed on the entire surface of the extension region.

Therefore, a large junction capacitance which cannot be neglected occurs in the boundary between the extension region and the pocket region, thereby degrading the operation performance.

BRIEF SUMMARY OF THE INVENTION

An object of this invention is to provide a semiconductor device in which the junction capacitance occurring in the boundary between the extension region and the pocket region can be reduced by reducing the size of the pocket region and a method for manufacturing the same.

In order to reduce the thickness of an impurity diffusion region of a first conductivity type formed near the surface of a semiconductor substrate, a pocket region is formed under the impurity diffusion region. If the pocket region is large, a junction capacitance between the impurity diffusion region and the pocket region cannot be neglected. In order to reduce the size of the pocket region to the minimum permissible size, the gates and dummy gates which are temporarily formed to suppress the non-uniformity of the gate dimensions by uniformly giving an influence of the optical proximity effect to a plurality of gates are used as a mask which is used when impurity is implanted into the surface region of the semiconductor substrate to form the pocket regions. Thus, the pocket region can be formed in a limited area between the gate and the dummy gate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

The most important feature of this invention is that the gates and dummy gates are used as a mask when pocket regions are formed by the ion-implantation technique in a MOSFET so as to enhance the controllability for the size of the pocket regions and suppress a junction capacitance in the boundary portion between the extension region and the pocket region. In order to attain the above feature, it is necessary to previously eliminate an error of the gate dimension. First, a method for eliminating the error of the gate dimension is explained.

Figure 6A:
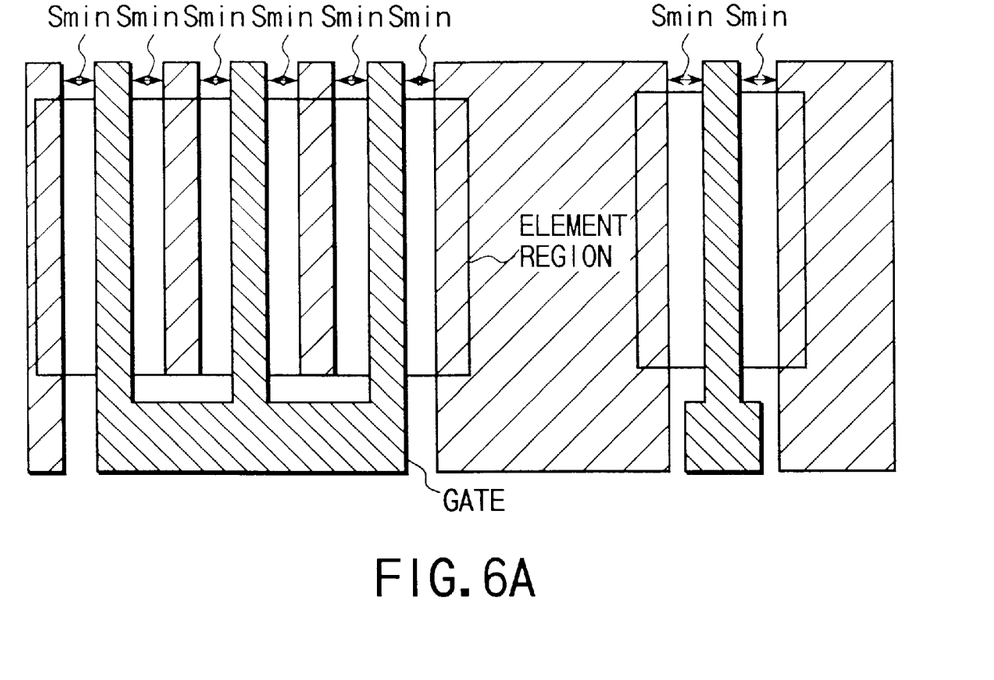
FIGS. 6A, 6B are plan views each showing a dummy gate pattern and a gate pattern of this invention.
Figure 6B:
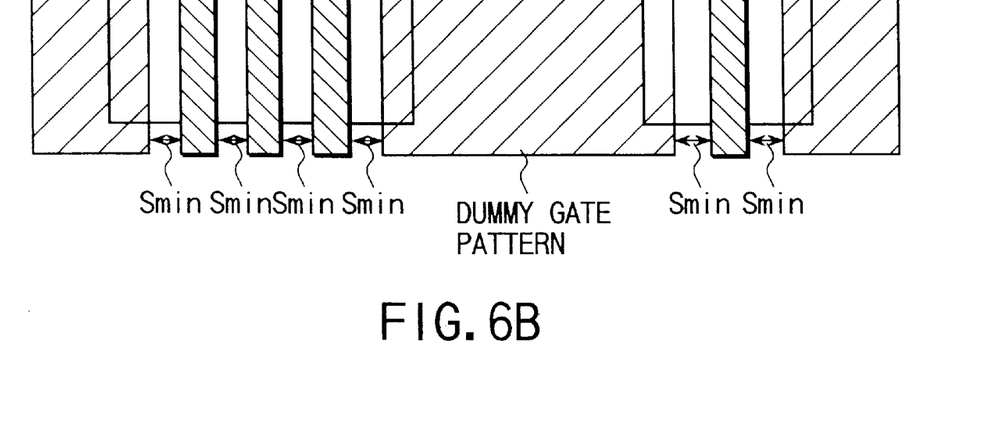

FIGS. 6A, 6B are plan views each showing a pattern of gates formed on the semiconductor substrate and having a pattern which is made uniform in the peripheral portion, and a method for precisely forming the gates according to the layout is explained. The gate interval (pitch) is set to various values. The minimum gate interval is indicated by "Smin". A dummy gate pattern is added to the gate pattern. The dummy gate is disposed at a distance of the minimum gate interval Smin from the adjacent gate. As a result, the intervals between two adjacent gates, a gate and an adjacent dummy gate, and two adjacent dummy gates are all set to the minimum gate interval Smin. Therefore, a difference in the step coverage of the gate electrode pattern in the local portion can be reduced.

Figure 7A:
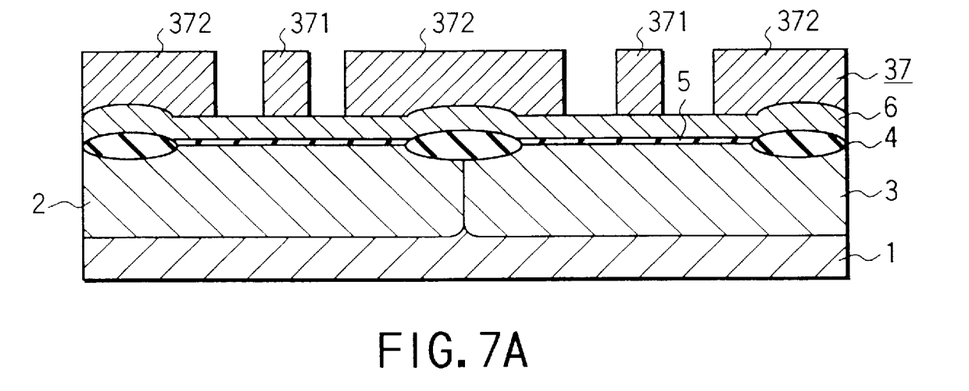
FIG. 7A is a cross sectional view showing the process of this invention for transferring the gate pattern and dummy gate pattern onto a photoresist.
Figure 7B:
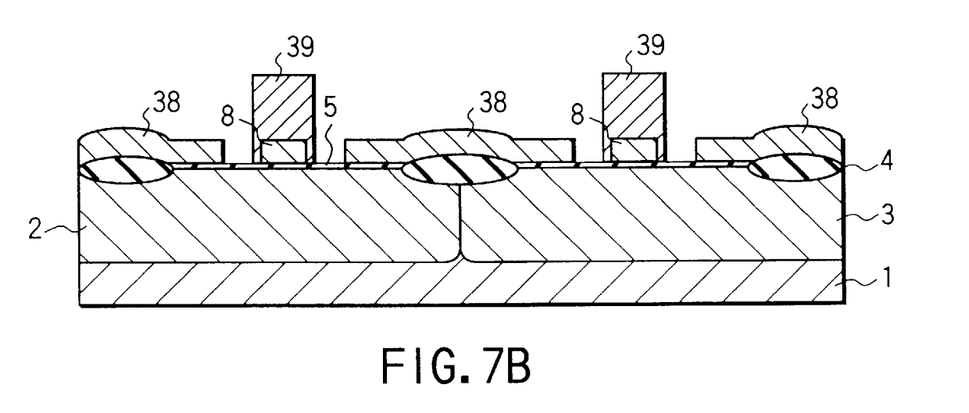
FIG. 7B is a cross sectional view showing the process of this invention for forming a photoresist used for removing dummy gates.
Figure 7C:
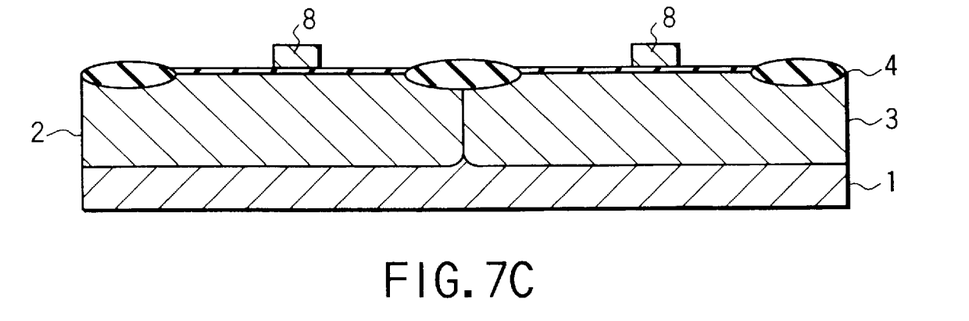
FIG. 7C is a cross sectional view showing the process of this invention for removing the dummy gates.

Next, an LSI manufacturing process using the gate mask is explained with reference to FIGS. 7A, 7B, 7C. Impurity diffusion regions (p well 2 and n well 3) used for forming nMOSFETs and pMOSFETs are formed in the surface region of a semiconductor substrate 1. After this, a field oxide film ($SiO_2$) 4 used for electrically isolating elements from one another is formed by the selective oxidation method. Then, diffusion layers are formed in portions near the surface portion of the semiconductor substrate in which transistors are formed by the ion-implantation technique by using a photoresist formed by, for example, the lithography process as a mask. The profiles of the impurity concentration of the diffusion layers in the depth direction are adjusted to attain desired threshold voltages (Vth) of the respective MOSFETs.

Next, a silicon oxide film 5 is formed on the semiconductor substrate 1 by the thermal oxidation method. The silicon oxide film 5 is used as a gate insulating film. A polysilicon film 6 is formed on the silicon oxide film 5 by the LPCVD method or the like. Then, a photoresist 37 is transferred by the lithography process (FIG. 7A). On the photoresist 37, gate patterns 371 and dummy gate patterns 372, which are disposed on both sides of the gate pattern at a distance of the minimum gate interval Smin, are drawn.

The polysilicon film 6 is subjected to an anisotropic etching process such as RIE having directivity and having a high selective etching ratio with respect to $SiO_2$ with the resists 371, 372 used as a mask so as to form gates 8 and dummy gates 38 having a preset pattern.

Thus, the process up to the step of forming the gates 8 is the same as the conventional process, but as shown in FIGS. 6A, 6B, the dummy gate pattern 38 is disposed at a distance of the minimum gate interval Smin in the LSI from the gate 8. As a result, the gates 8 and the dummy gates 38 are uniformly disposed at a constant interval Smin at the time of gate patterning process. Since the amount of the dimensional error caused by the optical proximity effect and the loading effect at the time of development and etching of the photoresist is determined depending on the gate interval, the amounts of the dimensional errors of the gates become equal to one another by uniformly arranging the gates 8 and the dummy gates 38 at the constant interval Smin, thereby making it possible to suppress a variation in the dimensional precision of the gate.

After the gate patterning process, a photoresist pattern 39 for covering the gates 8 is formed by use of the lithography process. Then, the isotropic or anisotropic etching process is effected with the photoresist pattern 39 used as a mask (FIG. 7A). By the etching process, the dummy gate pattern 38 is etched and removed based on the selective ratio with respect to the underlying gate oxide film ($SiO_2$) 5 (FIG. 7B).

In the above example, the interval between the dummy gate and the gate is set to the minimum gate interval in the LSI, but the dimensional variation can be suppressed by defining the above interval by the interval between the gates of parallel-connected MOSFETs in NAND, NOR gates frequently used in the LSI, that is, by the distance between the gates with one contact disposed therebetween by taking the manufacturing yield of the LSI into consideration. At this time, the distance between the gate electrode and the dummy pattern becomes four to six times the minimum gate dimension (minimum gate length dimension). If it is set to Smin, the minimum gate interval set when no dummy gate pattern is disposed becomes twice the value of Smin, and if the minimum patterning dimension for the dummy gate pattern is set to the minimum dimension Lmin of the gate, the minimum gate interval set when no dummy pattern is disposed becomes (Smin×2+Lmin).

From the above description, it is understood that if the dummy gate pattern is disposed while a distance to the gate is set by a constant ratio equal to or less than six times the minimum gate dimension, the layout in which the gate interval at the time of gate patterning process is larger than thirteen times the gate dimension will not occur and preferable gate dimension control can be attained. Further, Smin in the above description is defined by the minimum gate interval Smin≦the gate dimension×6.

Figure 8A:
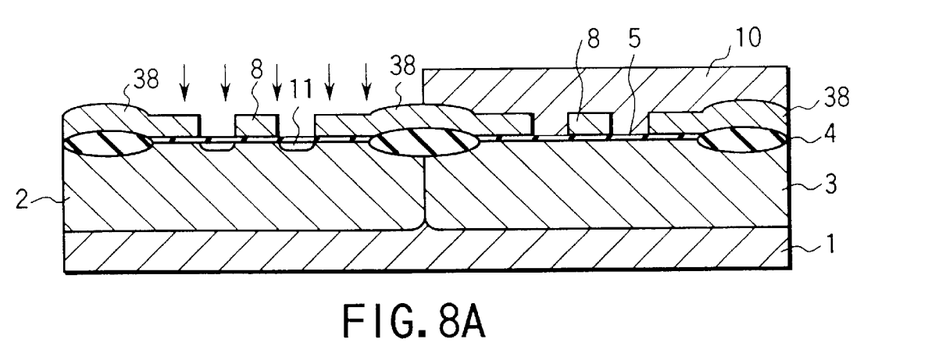
FIG. 8A is a cross sectional view showing the process of this invention for forming extension regions near the surface of a p well.

Next, the process for forming the extension regions in a controllable manner is explained with reference to FIGS. 8A, 8B. A p well 2 and n well 3 are formed in the surface area of the semiconductor substrate 1. The p well 2 and n well 3 are impurity diffusion regions used for forming nMOSFETs and pMOSFETs. Then, a field oxide film 4 used for electrically isolating elements from one another is formed by the selective oxidation method.

Next, an impurity is implanted into portions of the surface area of the semiconductor substrate 1 in which transistors are formed by the ion-implantation technique by using a photoresist formed by the lithography process as a mask. The profiles of the impurity concentration of the diffusion layers in the depth direction are adjusted according to the threshold voltages (Vth) of the respective transistors.

Next, a silicon oxide film 5 is formed on the semiconductor substrate 1 by the thermal oxidation method. The silicon oxide film 5 is used as a gate insulating film. A polysilicon film is formed on the silicon oxide film 5 by the LPCVD method or the like.

Then, a gate electrode pattern is transferred on the polysilicon film by the lithography process. Dummy gate patterns are disposed on both sides of the gate of the gate electrode pattern at a distance of the minimum gate interval from the gate.

The polysilicon film is subjected to the anisotropic etching process such as RIE having directivity and having a high selective etching ratio with respect to $SiO_2$ with the above patterns used as a mask so as to form gates 8 and dummy gates 38. Next, a photoresist 10 of a pattern which covers the n well 3 is formed on the semiconductor substrate 1. Then, As, P or the like is ion-implanted into the semiconductor substrate 1 with the gate 8, dummy gates 38 and photoresist 10 used as a mask. As a result, n-type extension regions 11 are formed in portions of the surface area of the semiconductor substrate 1 which are limited by the gate 8 and the dummy gates 38 (FIG. 8A).

In order to prevent ions from passing through the gate 8 and dummy gate 38 and reaching the semiconductor substrate 1, the range of ions is controlled so as not to exceed the total sum of the film thickness of the gate oxide film and the film thickness (approx. 250 nm) of the gate (or dummy gate).

Figure 8B:
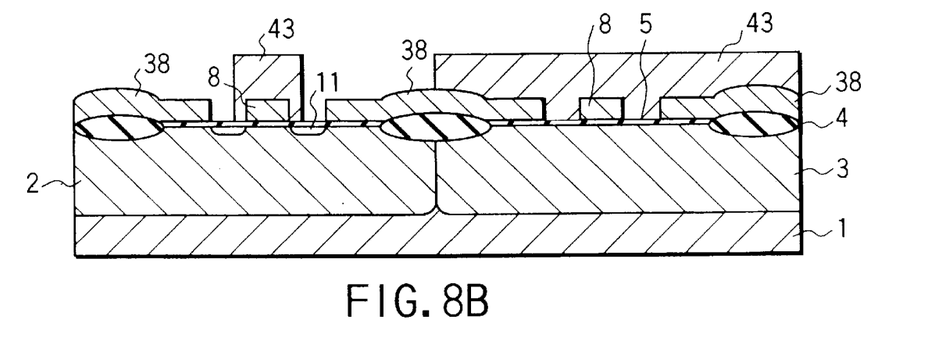
FIG. 8B is a cross sectional view showing the process of this invention for forming a photoresist used for removing the dummy gates after the process of FIG. 8A.

Next, after the photoresist 10 is removed, the entire surface of the n well 3 and the gate 8 on the p well 2 are covered with a photoresist 43 and the dummy gates 38 on the p well 2 are removed by etching with the photoresist 43 used as a mask (FIG. 8B).

Figure 9A:
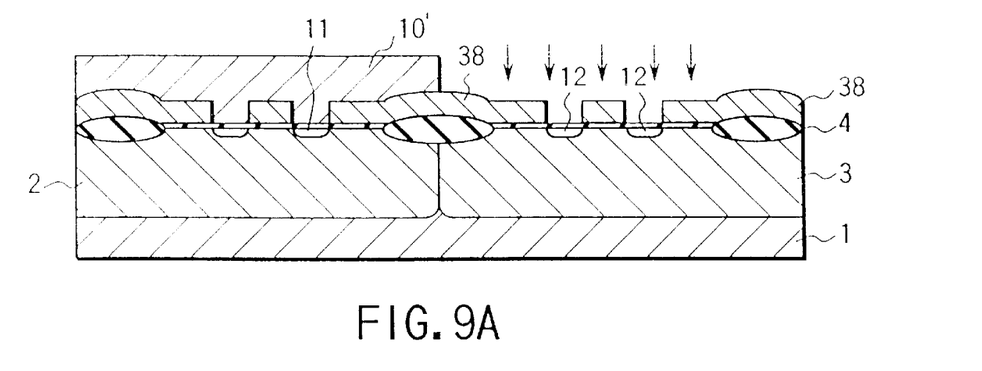
FIG. 9A is a cross sectional view showing the process of this invention for forming extension regions near the surface of an n well.

Next, a photoresist 10' of a pattern which covers the p well 2 is formed on the semiconductor substrate 1. Then, boron (B) or the like is ion-implanted into the semiconductor substrate 1 with the gate 8, dummy gates 38 and photoresist 10' used as a mask. As a result, p-type extension regions 12 are formed in portions of the surface area of the semiconductor substrate 1 which are limited by the gate 8 and the dummy gates 38 (FIG. 9A).

Figure 9B:
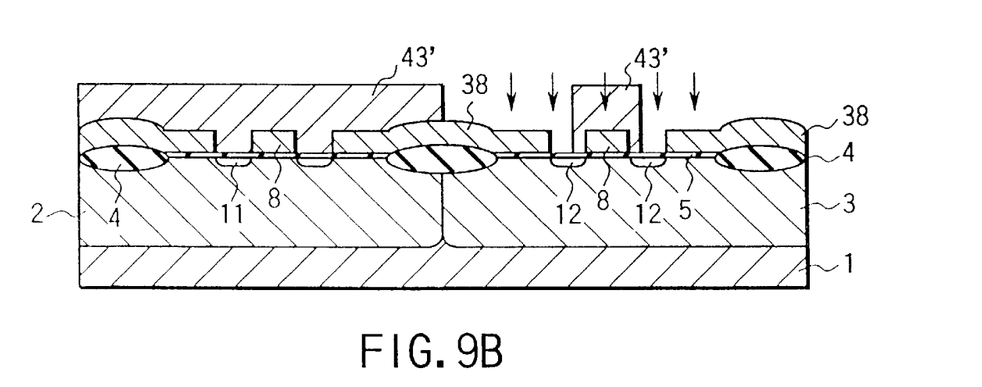
FIG. 9B is a cross sectional view showing the process of this invention for forming a photoresist used for removing the dummy gates after the process of FIG. 9A.

Next, after the photoresist 10' is removed, the entire surface of the p well 2 and the gate 8 on the n well 3 are covered with a photoresist 43' and the dummy gates 38 on the n well 3 are removed by etching with the photoresist 43' used as a mask (FIG. 9B).

Figure 9C:
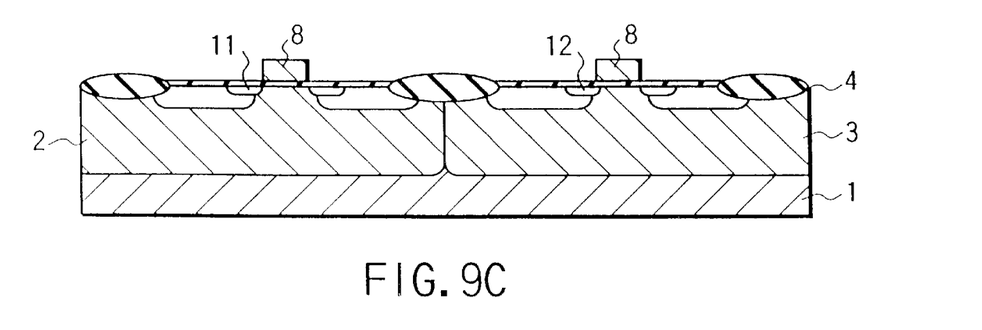
FIG. 9C is a cross sectional view showing the process of this invention for removing the photoresist after the process of FIG. 9B.

After this, the photoresist 43' is removed from the semiconductor substrate 1 (FIG. 9C).

According to the above method, the steps of removing the photoresist mask for forming the extension regions and the dummy gates can be effected in the same process in both cases of the n/pMOSFETs. At this time, the extension regions can be formed in a controllable manner in areas limited by the gate and the dummy gates without increasing the number of steps of the lithography process in comparison with the conventional process.

Figure 10A:
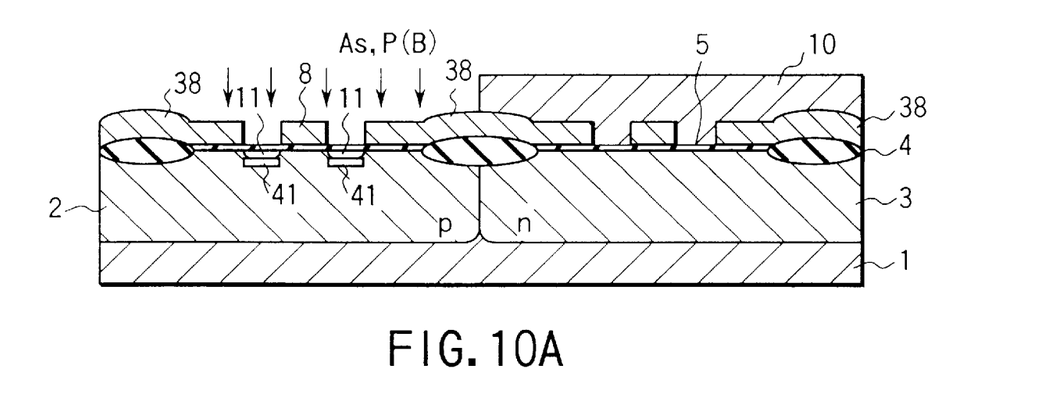
FIG. 10A is a cross sectional view showing the process of this invention for forming pocket regions under extension regions in a p well.
Figure 10B:
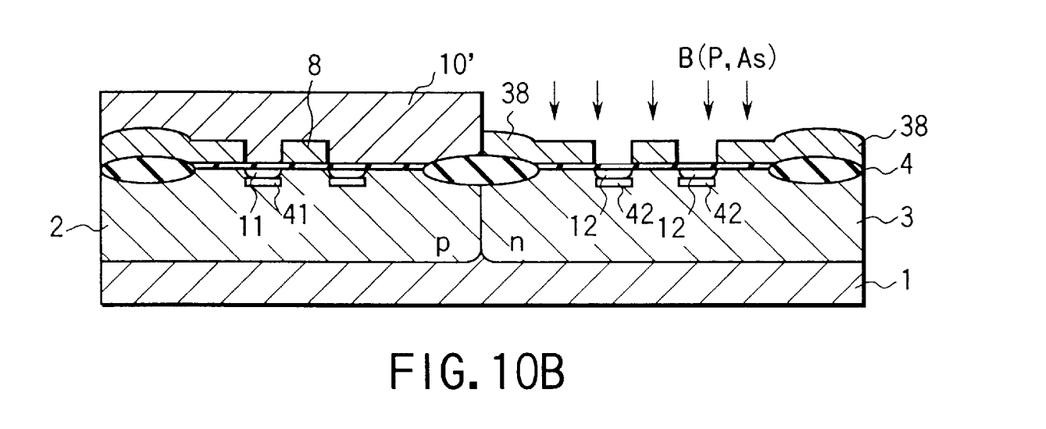
FIG. 10B is a cross sectional view showing the process of this invention for forming pocket regions under extension regions in an n well.

Next, a process for forming pocket regions under the extension regions is explained with reference to FIGS. 10A, 10B, 10C. A p well 2 and n well 3 are formed in the surface area of the semiconductor substrate 1. Then, a field oxide film 4 used as an element isolating region is formed by the selective oxidation method. Next, an impurity is implanted into portions of the surface area of the semiconductor substrate in which transistors are formed by the ion-implantation technique by using a photoresist (not shown) formed by the lithography process as a mask. The profiles of the impurity concentration of the diffusion layers are adjusted according to the threshold voltages (Vth) of the respective transistors.

Next, a silicon oxide film (gate insulating film) 5 is formed on the semiconductor substrate 1 by the thermal oxidation method. A polysilicon film is formed on the silicon oxide film 5 by the LPCVD method or the like. Then, a pattern of gates and dummy gates disposed at a pitch of the minimum gate interval is transferred as a photoresist by the lithography process.

After this, the polysilicon film is subjected to the anisotropic etching process such as RIE having directivity and having a high selective etching ratio with respect to $SiO_2$ with the above photoresist used as a mask. As a result, gates 8 and dummy gates 38 are formed.

Next, a photoresist 10 is formed on the semiconductor substrate 1 to cover the n well 3. Then, As, P or the like is ion-implanted into the semiconductor substrate 1 with the gate 8, dummy gates 38 and photoresist 10 used as a mask. As a result, n-type extension regions 11 are formed in portions of the surface area of the semiconductor substrate 1 which are limited by the gate 8 and the dummy gates 38.

Then, in the same manner as described above, impurity of a conductivity type such as boron (B) used for forming the p well is ion-implanted into portions of the semiconductor substrate 1 which are limited by the gate 8 and the dummy gates 38 with the gate 8, dummy gates 38 and photoresist 10 used as a mask. As a result, p-type impurity diffusion regions of impurity concentration higher than that of the p well 2, that is, so-called pocket regions 41 are formed under the extension regions 11 (FIG. 10A).

Thus, the size of the pocket region 41 can be adjusted with high precision by forming the pocket region 41 between the dummy gate 38 and the gate 8 with the dummy gate 38 and the gate 8 used as a mask. That is, a small pocket region 41 can be formed by reducing a distance between the dummy gate 38 and the gate 8. If the pocket region 41 is made smaller, a junction capacitance in the boundary portion between the extension region 11 and the pocket region 41 can be reduced.

Next, a photoresist (not shown) is formed to cover the gates 8 on the p well 2 and the dummy gate 38 on the p well 2 are removed by etching with the photoresist used as a mask.

Next, a photoresist 10' which covers the p well 2 is formed on the semiconductor substrate 1. Then, boron (B) or the like is ion-implanted into the semiconductor substrate 1 with the gate 8, dummy gates 38 and photoresist 10' used as a mask so as to form p-type extension regions 12 in portions of the n well of the surface area of the semiconductor substrate 1 which lie between the gate 8 and the dummy gates 38. Next, impurity of a conductivity type such as As, P used for forming the n well is ion-implanted by using the same mask so as to form n-type impurity diffusion regions of impurity concentration higher than that of the n well 3, that is, pocket regions 42 under the extension regions 12 (FIG. 10B).

Figure 10C:
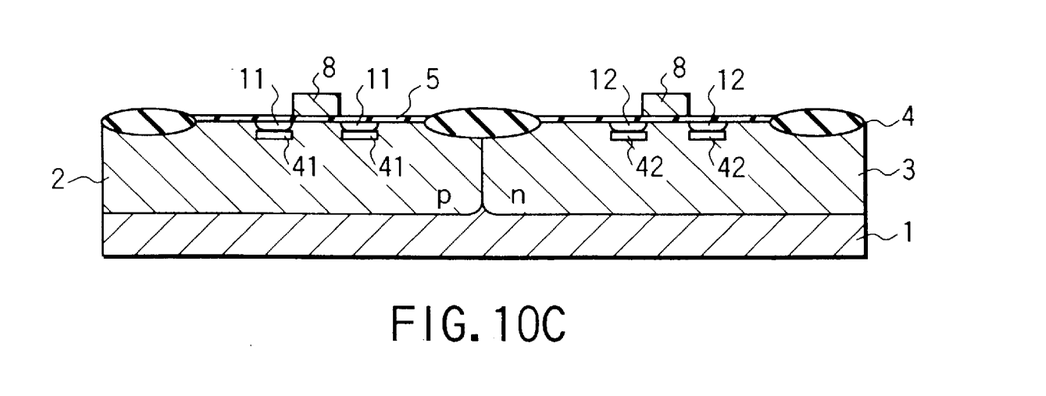
FIG. 10C is a cross sectional view showing the process of this invention for removing the dummy gates after the process of FIG. 10B.

Next, a photoresist (not shown) is formed to cover the gates 8 on the n well 3 and the dummy gate 38 on the n well 3 are removed by etching with the photoresist used as a mask (FIG. 10C). In the process after this, the same process as in the conventional case is effected to form an nMOSFET in the p well and a pMOSFET in the n well in which a variation in the gate dimension is suppressed.

In order to improve the short channel characteristic, pocket regions are formed under the extension regions by ion-implanting impurity of a conductivity type different from that of the extension region and the impurity profile of the extension region is made steep to improve the punch-through characteristic.

The gate-to-gate distance is set to be equal to or longer than the minimum gate interval Smin and less than six times the gate length dimension (minimum gate interval≦Smin≦gate length dimension×6). With the above gate structure, a pocket region is formed with part of the drain region covered with the dummy pattern and thus the pocket region is formed only in a partial area under the drain region. Therefore, an increase in the junction capacitance due to the ion-implantation for forming the pocket region can be suppressed.

With the above method, the gates and the dummy gates are simultaneously formed in the nMOSFET region and pMOSFET region, but as will be described below, the gates and the dummy gates may be separately formed in the nMOSFET region and in the pMOSFET region.

Figure 11A:
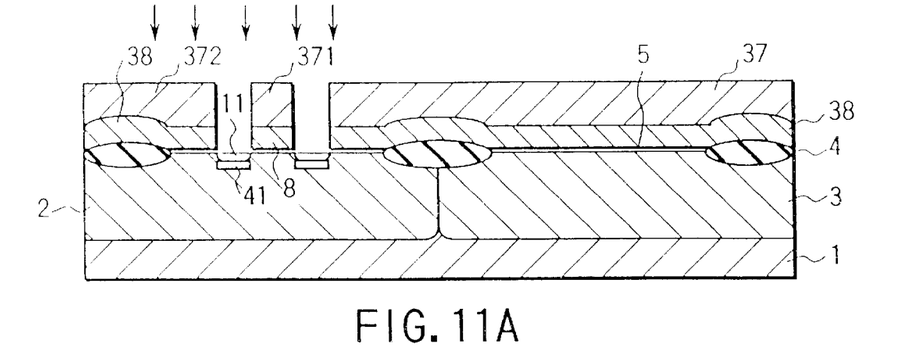
FIG. 11A is a cross sectional view showing another process of this invention for forming pocket regions under extension regions in a pMOSFET region.

First, a p well 2 and n well 3 are formed in the surface area of the semiconductor substrate 1. Then, a field oxide film 4 for element isolation is formed by the selective oxidation method. Next, an impurity is implanted into the surface area of the semiconductor substrate in which transistors are formed by the ion-implantation technique by using a photoresist formed by the lithography process as a mask. The profiles of the impurity concentration of the diffusion layers are adjusted according to the threshold voltages (Vth) of the respective transistors. Next, a silicon oxide film 5 is formed on the semiconductor substrate 1 as a gate insulating film by the thermal oxidation method. A polysilicon film is formed on the silicon oxide film 5 by the LPCVD method or the like.

Then, a gate pattern 371 and dummy gate patterns 372 disposed on both sides of the gate pattern 371 at a distance of the minimum gate interval from the gate pattern are transferred onto a photoresist 37 by the lithography process. After this, the polysilicon film is subjected to the anisotropic etching process such as RIE having directivity and having a high selective etching ratio with respect to $SiO_2$ with the above photoresist used as a mask so as to form a gate 8 and dummy gates 38 on the p well 2.

Next, n-type impurity such as As, P is ion-implanted into the semiconductor substrate 1 with the photoresist 37 used as a mask. As a result, n-type extension regions 11 are formed in portions of the surface area of the semiconductor substrate 1 which lie between the gate 8 and the dummy gates 38.

Then, the same photoresist 37 is used as a mask and impurity of a conductivity type such as boron (B) used for forming the p well is ion-implanted. As a result, p-type impurity diffusion regions of impurity concentration higher than that of the p well 2, that is, pocket regions 41 are formed in areas which lie under the extension regions 11 and between the gate 8 and the dummy gates 38 (FIG. 11A).

Figure 11B:
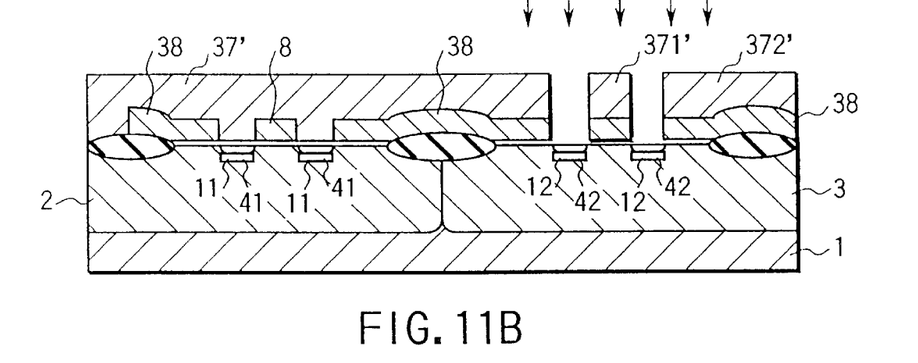
FIG. 11B is a cross sectional view showing the process of this invention for forming pocket regions under extension regions in an nMOSFET region.

Then, after the photoresist 37 is removed, a gate pattern 371' and dummy gate patterns 372' disposed on both sides of the gate pattern 371' at a distance of the minimum gate interval from the gate pattern are transferred onto a photoresist 37' by the lithography process. After this, the polysilicon film is subjected to the anisotropic etching process such as RIE having directivity and having a high selective etching ratio with respect to $SiO_2$ with the above photoresist used as a mask. As a result, a gates 8 and dummy gate 38 are formed on the n well 3. Before removing the photoresist 37', a p-type impurity such as boron is ion-implanted into the semiconductor substrate 1 with the photoresist 37' used as a mask so as to form p-type extension regions 12 in areas between the gate 8 and the dummy gates 38.

Then, the same photoresist 37' is used as a mask and an impurity of a conductivity type such as As, P used for forming the n well is ion-implanted. As a result, n-type impurity diffusion regions of impurity concentration higher than that of the n well 3, that is, pocket regions 42 are formed in areas which lie under the extension regions 12 and between the gate 8 and the dummy gates 38 (FIG. 11B).

Figure 12A:
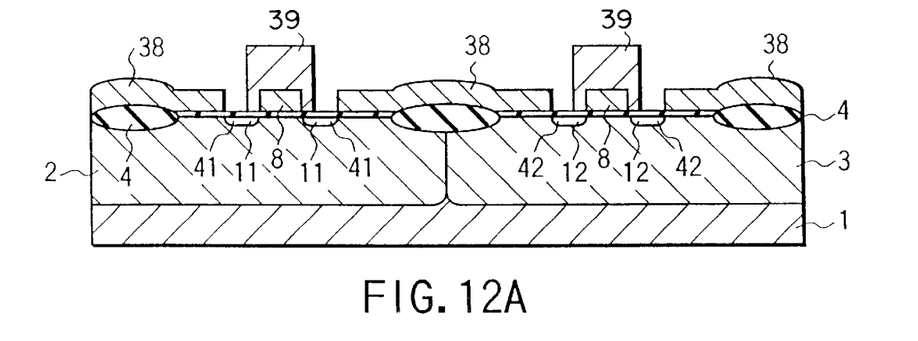
FIG. 12A is a cross sectional view showing the process of this invention for forming a photoresist used for removing the dummy gates after the process of FIG. 11B.
Figure 12B:
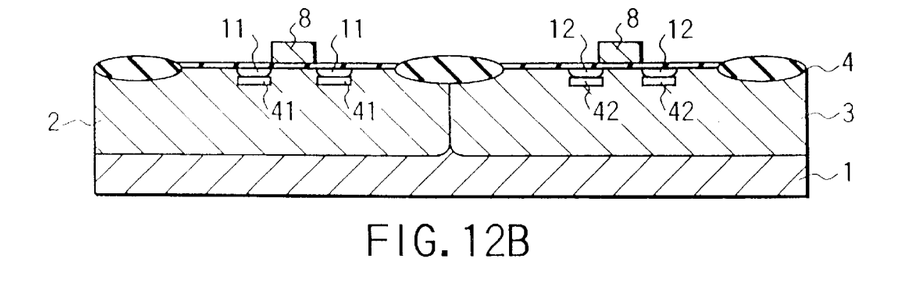
FIG. 12B is a cross sectional view showing the process of this invention for removing the dummy gates after the process of FIG. 12A.

After this, the photoresist 37' is removed and a photoresist 39 of a pattern which covers the gate 8 is formed on the semiconductor substrate 1 (FIG. 12A). Then, the dummy gates 38 are removed by etching with the photoresist 39 used as a mask (FIG. 12B). In the process after this, the same process as in the conventional case is effected to form an nMOSFET in the p well and a pMOSFET in the n well in which a variation in the gate dimension is suppressed.

In this case, after the gate patterning process for the n/pMOSFETs and before the process of removing the photoresist 37' for formation of the gate, small pocket regions can be formed under portions of the drain regions by forming extension regions and pocket regions with the photoresist 37' used as a mask.

Further, since the ion-implantation process is effected while the photoresist used for patterning the gate is left behind as it is, impurity can be prevented from passing through the gate to give an influence on the threshold voltage even if impurity is doped by the ion-implantation in a condition of an acceleration voltage which permits the impurity to travel a distance of the film thickness of the gate material or more. In the above manufacturing method, an impurity ion, and more particularly, an impurity for suppressing the punchthrough can be doped from the substrate surface into a deep region exceeding the thickness of the gate. Further, after the impurity doping for the gates of the n/pMOSFETs and extension/pocket regions is terminated, the etching process for removing the dummy gate pattern of the n/pMOSFETs can be effected by one lithography process so that a process in which the number of the lithography steps is not increased in comparison with the conventional manufacturing method can be attained.

Figure 13A:
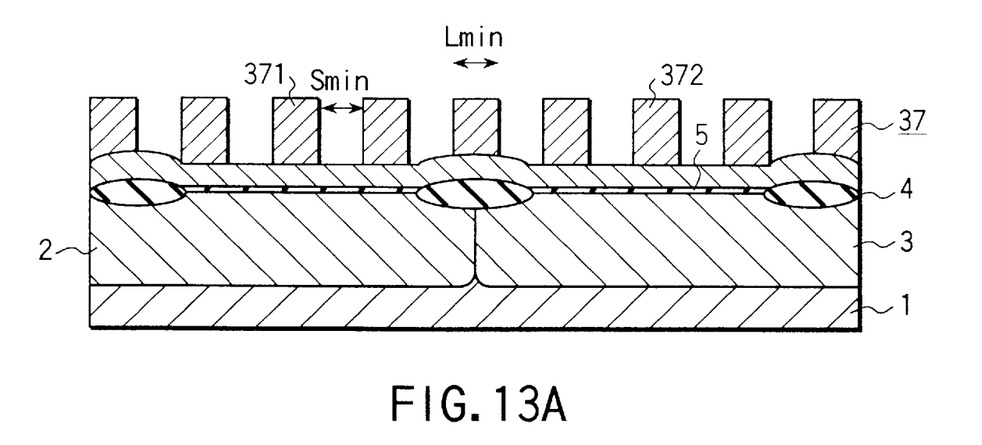
FIG. 13A is a cross sectional view showing another process of this invention for transferring the gate pattern onto a photoresist.

The positional relation between the dummy gate pattern and the gate is explained in more detail with reference to FIGS. 13A, 13B. A p well. 2 and n well 3 are formed in the surface area of the semiconductor substrate 1. Then, a field oxide film 4 used as an element isolating region is formed by the selective oxidation method. Next, impurity is implanted into the surface area of the semiconductor substrate 1 in which transistors are formed by the ion-implantation technique by using a photoresist formed by the lithography process as a mask. The profiles of the impurity concentration of the diffusion layers are adjusted according to the threshold voltages (Vth) of the respective transistors.

Next, a silicon oxide film 5 is formed as a gate insulating film on the semiconductor substrate 1 by the thermal oxidation method. A polysilicon film is formed on the silicon oxide film 5 by the LPCVD method or the like. Then, a gate pattern 371 and dummy gate patters 371 disposed on both sides of the gate pattern 372 at a distance of the minimum gate interval Smin from the gate pattern are transferred on a photoresist 37 by the lithography process (FIG. 13A). After this, the polysilicon film 6 is subjected to the anisotropic etching process such as RIE having directivity and having a high selective etching ratio with respect to $SiO_2$ with the above photoresist used as a mask, and as a result, gates 8 and dummy gates 38 are simultaneously formed.

Figure 13B:
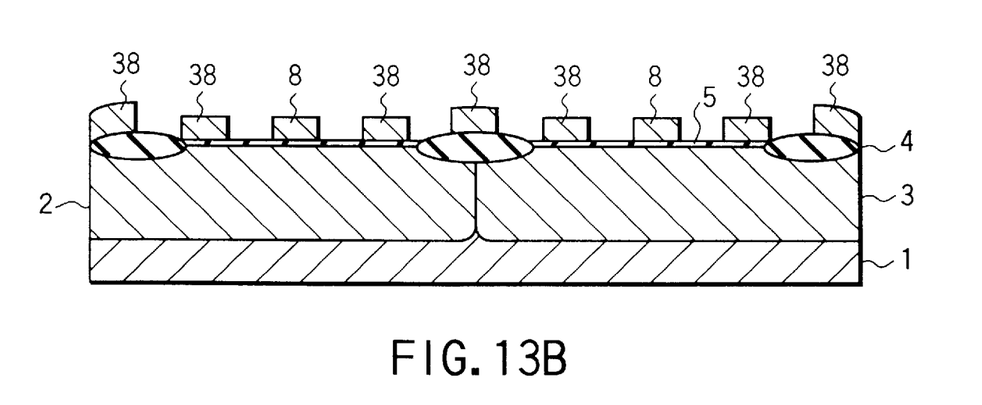
FIG. 13B is a cross sectional view showing the arrangement of the gates and the dummy gates in this invention.

A plurality of dummy gates 38 are arranged in parallel to the gates 8 in a condition of minimum gate interval ≦ gate dimension (Lmin)×6 (FIG. 13B). According to the above method, the interval between the gates 8 can be kept within a preset range and the optical proximity effect can be suppressed. The dummy gates have the same length (Lmin) as the gate and they are arranged at the same interval.

Figure 14A:
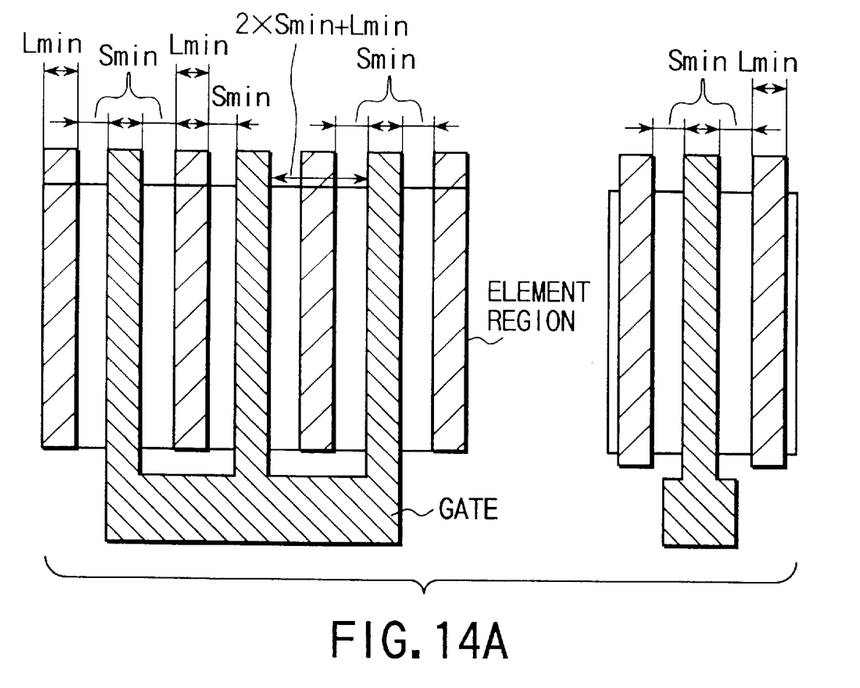
FIGS. 14A, 14B are plan views showing the arrangement of the gates and the dummy gates in this invention.
Figure 14B:
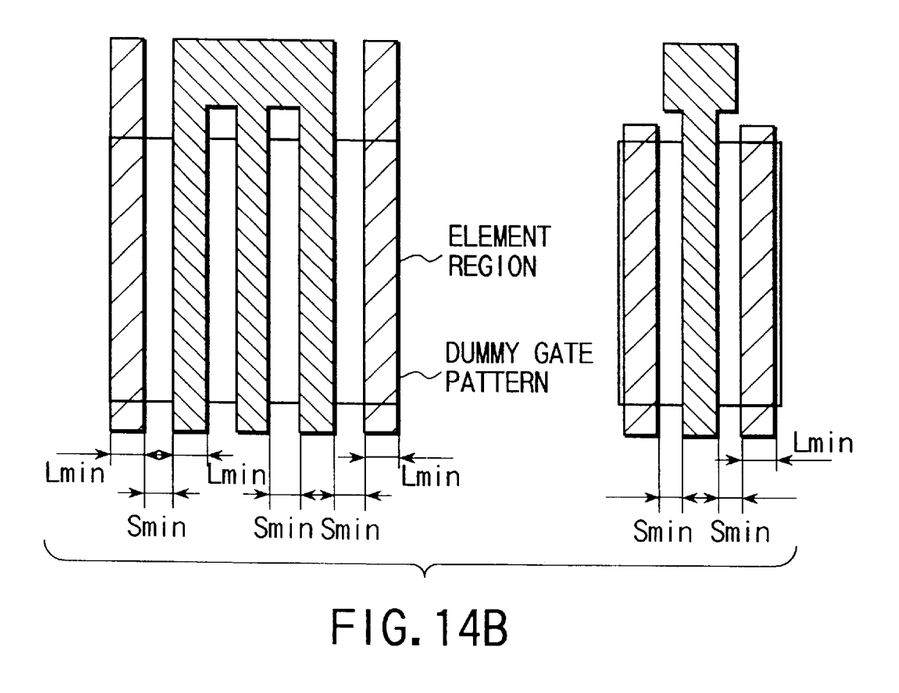

FIGS. 14A, 14B show the arrangement of the gates and dummy gates on the semiconductor substrate. In the layout of MOSFETs constructing a logic device, the gate-gate interval is determined based on the presence or absence of a contact formed on the diffusion region between the gates and the gate is independently disposed in some cases as is clearly understood when considering three representative gate types of NAND, NOR and INV (inverter).

If the gate-to-gate distance in a case where no contact is disposed is set to Smin and the gate-to-gate distance in a case where a contact is disposed is set to a value (2 Smin+Lmin) obtained by adding the minimum gate dimension Lmin to a value which is twice the gate-to-gate distance Smin set in a case where no contact is disposed, the pitch of the arrangement of electrodes can be made constant by disposing dummy gate patterns and the optical proximity effect and the loading effect at the time of development, etching can be suppressed and the gate dimensional precision can be enhanced by disposing dummy patterns on both sides of an independent pattern and disposing at least one dummy pattern on the external sides of the array of the gates at the above pitch.

Next, a process for forming the source/drain regions is explained with reference to FIGS. 15A, 15B, 16A, 16B. An element isolation region (STI:Shallow Trench Isolation) 4 is formed in the surface area of a p-type semiconductor substrate 1. Then, an impurity is implanted into the surface area of the semiconductor substrate 1 in which transistors are formed to attain an impurity profile corresponding to the threshold voltages (Vth) of the respective transistors by the ion-implantation technique by using a photoresist (not shown) formed by the lithography process as a mask.

Figure 15A:
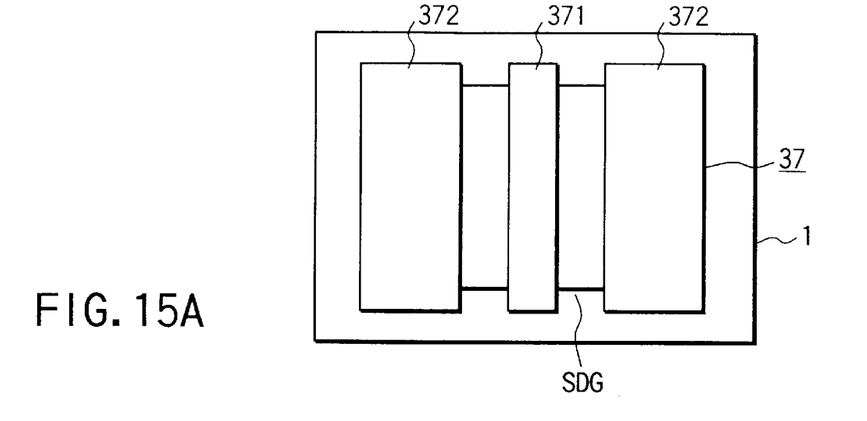
FIG. 15A is a plan view showing the process of this invention for transferring the gate pattern and dummy gate pattern onto a photoresist.
Figure 15B:
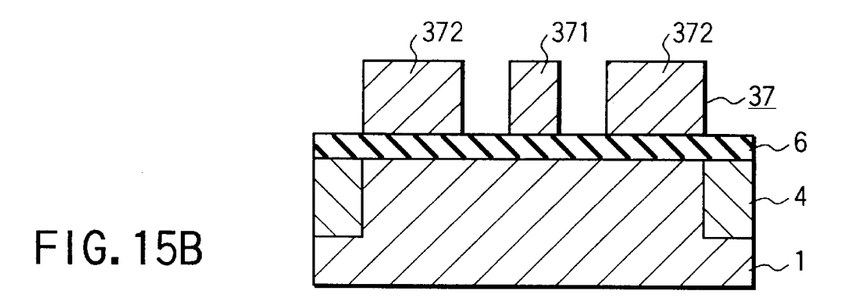
FIG. 15B is a cross sectional view showing the process of this invention for transferring the gate pattern and dummy gate pattern onto a photoresist.

Next, a silicon oxide film used as a gate insulating film is formed on the semiconductor substrate 1 by the thermal oxidation method and a polysilicon film is formed on the silicon oxide film by the LPCVD method or the like. Then, a gate pattern 371 and dummy gate patterns 372 are transferred onto the polysilicon film by the lithography process so as to form a photoresist 37 (FIGS. 15A, 15B).

After this, the polysilicon film is subjected to anisotropic etching process such as RIE having directivity and having a high selective etching ratio with respect to $SiO_2$ with the above photoresist used as a mask so as to form a gate 8 with the gate length L1 and dummy gates 38 with the gate length L2 in the adjacent positions thereof.

Figure 16A:
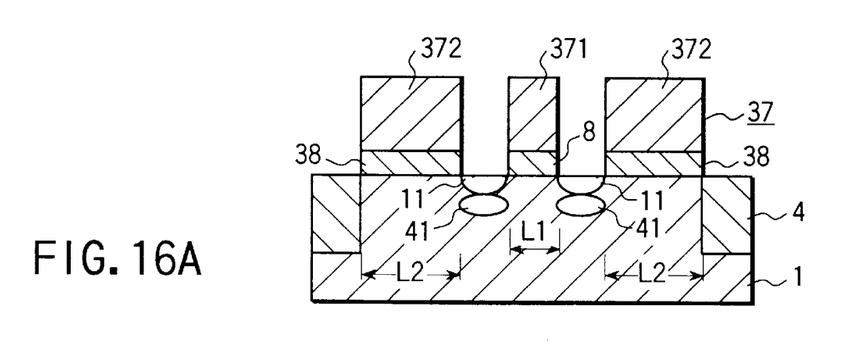
FIG. 16A is a cross sectional view showing the process of this invention for forming pocket regions under extension regions in an nMOSFET.

Next, As, P or the like is ion-implanted into the semiconductor substrate 1 with the gate 8 and dummy gates 38 used as a mask. As a result, n-type extension regions 11 are formed at an intermediate concentration of approx. 5E18 to 1E20 $cm^{-3}$ between the gate 8 and the dummy gates 38.

Figure 16B:
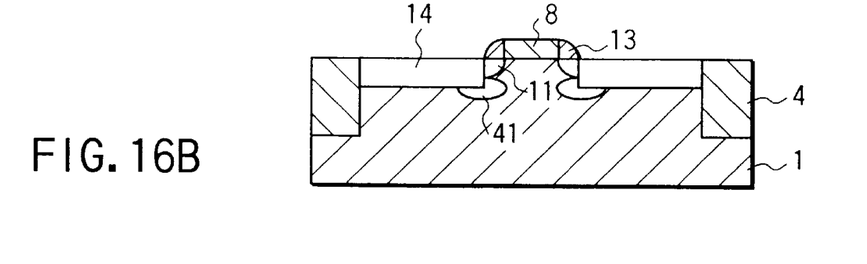
FIG. 16B is a cross sectional view showing an nMOSFET having pocket regions whose size is reduced according to this invention.

Then, the same gate 8 and dummy gates 38 are used as a mask and an impurity such as boron (B) having the same conductivity type as the semiconductor substrate is ion-implanted. As a result, p-type impurity diffusion regions of impurity concentration of 1E17 $cm^{-3}$ or more which is higher than that of the semiconductor substrate 1, that is, pocket regions 41 are formed under the extension regions 11 (FIG. 16B).

Then, a photoresist (not shown) is formed to cover the gates 8 and the dummy gate 38 are removed by etching with the above photoresist used as a mask. The diffusion regions 11, 41 are annealed at 1000° C. for approx. 30 and activated, then an $Si_3N4$ insulating film with a film thickness of approx. 100 nm is formed on the entire surface of the semiconductor substrate 1, and the insulating film is selectively etched in preference to the underlying $SiO_2$ insulating film 5 by the anisotropic etching process to form side wall insulating films 13.

Further, like the case of formation of the extension regions 11, n-type impurity such as As, P is ion-implanted into the semiconductor substrate 1 with the gate 8 and side wall insulating films 13 used as a mask to form n-type source/drain regions 14 of high impurity concentration of approx. 1E20 to 1E21 $cm^{-3}$. Then, the diffusion regions 14 are annealed at 1000° C. for approx. 30 sec. and activated to form an nMOSFET (FIG. 16B).

In the process after this, the same process as in the conventional case is effected to form an nMOSFET in which a variation in the gate dimension is suppressed. With the above gate structure, a pocket region is formed with part of the drain region covered with the dummy pattern and thus the pocket region is formed only in a partial area under the drain region. Therefore, an increase in the junction capacitance due to the ion-implantation for the pocket region can be suppressed.

In this invention, the dummy gate pattern used for improving the gate dimensional precision as described above can feed back a dimensional variation caused in the process to the entire portion in an area such as an internal area of a memory cell in which the same pattern is repeated. Further, this invention relates to another random gate.

In the above embodiments, a gate formed of polycrystalline silicon is explained, but a gate material used in this invention may be a laminated structure of refractory metal Ti, W, Co, Ni, Pd, Mo or silicon compound thereof and polycrystalline silicon, or the silicon compound of the above metal, or it may be salicide using the above metal. Further, the dummy gate pattern can be used not only in the lithography for forming the gate pattern but also in the lithography for forming a metal wiring layer or element region. Further, in all of the above embodiments, a case wherein the lithography technique is used is explained, but this invention is also effective in another process for transferring a pattern, for example, a direct drawing process by use of an electron beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method for manufacturing a semiconductor device, comprising the steps of:

forming a well region on a semiconductor substrate;

forming gates and dummy gates above the well region;

implanting impurity of a first conductivity type into the well region to form impurity diffusion regions near the surface of the well region;

implanting impurity of a second conductivity type into the well region with the gates and dummy gates used as a mask to form pocket regions in areas lying under the impurity diffusion regions and limited between the gates and the dummy gates; and removing the dummy gates.

2. A method according to claim 1, further comprising the steps of forming side wall insulating films on the side surfaces of the gates after removing the dummy gates; and implanting impurity of the first conductivity type into the surface area of the semiconductor substrate with the gates and side wall insulating films used as a mask to form source/drain regions.

3. A method according to claim 1, wherein a dummy gate is disposed substantially in parallel to an adjacent gate and at a preset interval from the adjacent gate.

4. A method according to claim 1, wherein the dummy gates are positioned to cause the gates and the dummy gates to be arranged at a preset interval.

5. A method according to claim 4, wherein the interval between two adjacent gates, a dummy gate and an adjacent gate, and two adjacent dummy gates is set to the minimum interval at which the gates are arranged.

6. A method according to claim 4, wherein the interval is not larger than six times the width of a gate.

7. A method for manufacturing a semiconductor device, comprising the steps of:

forming a well region on a semiconductor substrate;

forming a gate material layer above the well region;

forming a photoresist on the gate material layer;

transferring a gate pattern and dummy gate pattern onto the photoresist;

etching the silicon film masked by the photoresist to form gates and dummy gates above the well region;

implanting impurity of a first conductivity type into the well region to form impurity diffusion regions near the surface of the well region;

implanting impurity of a second conductivity type into the well region with the photoresist, gates and dummy gates used as a mask to form pocket regions in areas lying under the impurity diffusion regions and limited between the gates and the dummy gates; and removing the photoresist and dummy gates;

removing the dummy gates.

8. A method according to claim 7, further comprising the steps of forming side wall insulating films on the side surfaces of the gates after removing the dummy gates; and implanting impurity of the first conductivity type into the surface area of the semiconductor substrate with the gates and side wall insulating films used as a mask to form source/drain regions.

9. A method according to claim 7, wherein a dummy gate is disposed substantially in parallel to an adjacent gate and at a preset interval from the adjacent gate.

10. A method according to claim 7, wherein the dummy gates are positioned to cause the gates and the dummy gates to be arranged at a preset interval.

11. A method according to claim 10, wherein the interval between two adjacent gates, a dummy gate and an adjacent gate, and two adjacent dummy gates is set to the minimum interval at which the gates are arranged.

12. A method according to claim 10, wherein the interval is not larger than six times the width of a gate.

13. A method for manufacturing a semiconductor device, comprising the steps of:

forming a p well and an n well on a semiconductor substrate;

forming first gates and first dummy gates above the p well;

implanting impurity of a first conductivity type into the p well to form first impurity diffusion regions near the surface of the p well;

implanting impurity of a second conductivity type into the p well with the first gates and first dummy gates used as a mask to form first pocket regions in areas lying under the first impurity diffusion regions and limited between the first gates and the first dummy gates;

forming second gates and second dummy gates on the n well;

implanting impurity of the second conductivity type into the n well to form second impurity diffusion regions near the surface of the n well;

implanting impurity of the first conductivity type into the n well with the second gates and second dummy gates used as a mask to form second pocket regions in areas lying under the second impurity diffusion regions and limited between the second gates and the second dummy gates; and removing the first and second dummy gates;

removing the dummy gates.

14. A method according to claim 13, further comprising the steps of forming side wall insulating films on the side surfaces of the first and second gates after removing the first and second dummy gates; and implanting impurity of the first conductivity type into the surface areas of the p well and n well with the first and second gates and side wall insulating films used as a mask to form source/drain regions.

15. A method according to claim 13, wherein the first and second dummy gates are disposed substantially in parallel to the first and second gates and at a preset interval from the first and second gates.

16. A method according to claim 13, wherein the first and second dummy gates are positioned to cause the first and second gates and the first and second dummy gates to be arranged at a preset interval.

17. A method according to claim 16, wherein the interval between two adjacent gates, a dummy gate and an adjacent gate, and two adjacent dummy gates is set to the minimum interval at which the first and second gates are arranged.

18. A method according to claim 16, wherein the interval is not larger than six times the width of the first and second gates.

19. A method for manufacturing a semiconductor device, comprising the steps of:

forming gates and dummy gates on a semiconductor substrate;

implanting an impurity of a first conductivity type into the semiconductor substrate to form impurity diffusion regions near the surface of the semiconductor substrate;

implanting an impurity of a second conductivity type into the semiconductor substrate using the gates and dummy gates as a mask to form pocket regions only in areas between the gates and the dummy gates and immediately beneath the impurity diffusion regions; and removing the dummy gates.

* * * * *